United States Patent
Akiyama et al.

(10) Patent No.: US 7,790,571 B2
(45) Date of Patent: Sep. 7, 2010

(54) SOQ SUBSTRATE AND METHOD OF MANUFACTURING SOQ SUBSTRATE

(75) Inventors: Shoji Akiyama, Gunma (JP); Yoshihiro Kubota, Gunma (JP); Atsuo Ito, Gunma (JP); Koichi Tanaka, Gunma (JP); Makoto Kawai, Gunma (JP); Yuuji Tobisaka, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/984,184

(22) Filed: Nov. 14, 2007

(65) Prior Publication Data
US 2008/0119028 A1 May 22, 2008

(30) Foreign Application Priority Data
Nov. 22, 2006 (JP) .............................. 2006-315363

(51) Int. Cl.
*H01L 21/78* (2006.01)
(52) U.S. Cl. .............................. 438/458; 257/E21.599; 257/E21.568
(58) Field of Classification Search ................. 438/458, 438/455; 257/E21.211, E21.085, E21.04, 257/E21.002, E21.001, E21.599
See application file for complete search history.

(56) References Cited

U.S. PATENT DOCUMENTS

| 6,066,579 | A * | 5/2000 | Matsushita et al. .......... 438/795 |
| 6,413,874 | B1 * | 7/2002 | Sato ............................. 438/714 |
| 7,056,808 | B2 * | 6/2006 | Henley et al. ................ 438/458 |
| 2001/0016401 | A1 * | 8/2001 | Mitani et al. ................. 438/458 |
| 2003/0170990 | A1 * | 9/2003 | Sakaguchi et al. .......... 438/690 |
| 2006/0040469 | A1 * | 2/2006 | Aga et al. .................... 438/458 |

FOREIGN PATENT DOCUMENTS

JP B2-3048201 6/2000

OTHER PUBLICATIONS

Auberton-Herve et al.; "Smart Cut Technology: Industrial Status of SOI Wafer Production and New Material Developments;" Electrochemical Society Proceedings; vol. 99; No. 3; pp. 93-106; 1999.
Realize Co., USC Semiconductor Substrate Technique Research Institute; "The Science of S0I;" Chapter 2; pp. 59-66; 2000.
Sato et al.; "Hydrogen Annealed Silicon-on-Insulator;" American Institute of Physics; *Appl. Phys. Lett.*; vol. 65; No. 15; pp. 1924-1926; Oct. 10, 1994.

* cited by examiner

*Primary Examiner*—Julio J Maldonado
*Assistant Examiner*—Michele Fan
(74) *Attorney, Agent, or Firm*—Oliff & Berridge, PLC

(57) ABSTRACT

A method of manufacturing an SOQ substrate and an SOQ substrate manufactured by the same are disclosed. In the method, hydrogen ions are implanted to a surface of a single crystal Si substrate through an oxide film to uniformly form an ion implanted layer at a predetermined depth from the surface of the single crystal Si substrate, and a bonding surface of the substrate undergoes a plasma treatment or an ozone treatment. An external shock is applied onto the single crystal Si substrate and quartz substrate, which are bonded together, to mechanically delaminate a silicon film from a single crystal silicon bulk. In this way, the SOQ film is formed on the quartz substrate through the oxide film. To further smooth the SOQ film surface, hydrogen heat treatment is performed at a temperature of 1000° C. or less below a quartz glass transition point.

21 Claims, 2 Drawing Sheets

SOQ SUBSTRATE AND METHOD OF MANUFACTURING SOQ SUBSTRATE

This application claims priority under 35 U.S.C. §119(a)-(d) to JP 2006-315363, filed Nov. 22, 2006. The disclosure of JP 2006-315363 is hereby incorporated by reference herein in its entirety.

BACKGROUND OF THE INVENTION

1. Field of the Invention

The present invention relates to an SOQ substrate where a silicon film is formed on a quartz substrate and a method for manufacturing the same.

2. Description of the Related Art

An SOQ (Silicon on Quartz) substrate having a silicon thin film formed on a quartz substrate is an SOI substrate expected to be applied to optical devices, for example, a device for manufacturing a TFT liquid crystal monitor. In recent years, this substrate has received attentions as a substrate intended for applications other than a general SOI substrate. To fabricate such an SOQ substrate, there is proposed a method of bonding substrates of different materials, a silicon substrate for forming an SOI layer and a quartz substrate as a handling substrate to form a silicon thin film on the quartz substrate.

Hitherto, a SOITEC method (SmartCut method) has been known as a method of bonding two substrates to manufacture an SOI substrate. This method bonds a silicon substrate prepared by implanting hydrogen ions into a bonding surface side to a handling substrate and performs heat treatment at approximately 500° C. or more to thermally delaminate a silicon thin film from a region implanted with hydrogen ions in the highest concentration. This method is based on a mechanism that "air bubbles" called "hydrogen blisters" generated at high density through hydrogen ion implantation are let "grow" under heating, and a silicon thin film is delaminated through the "bubble growth" (for example, Japanese Patent No. 3048201 or A. J. Auberton-Herve et al., "SMART CUT TECHNOLOGY: INDUSTRIAL STATUS of SOI WAFER PRODUCTION and NEW MATERIAL DEVELOPMENTS" (Electrochemical Society Proceedings Volume 99-3 (1999) p. 93-106).).

However, manufacturing an SOQ substrate with the above SOITEC method involves the following problems. According to the SOITEC method, a silicon substrate and a support substrate (insulator substrate) are bonded together and then, thermally delamination is executed along a hydrogen ion implanted boundary at a temperature of 500° C. or more. However, if two substrates having different thermal expansion coefficients, for example, a silicon substrate and a quartz substrate, are bonded and subjected to heat treatment at 500° C. or more, a thermal strain is caused by a thermal expansion coefficient difference between the two substrates, and delamination along a bonded surface or cracking tends to occur due to the thermal strain. Therefore, it is desirable to complete delamination of a silicon thin film with a lower-temperature process. In general, however, two substrates that are bonded together should be subjected to heat treatment at higher temperature in order to ensure a satisfactory bonded state throughout the entire bonding surfaces of the silicon substrate and the quartz substrate, and high bonding strength.

That is, in the case of bonding a silicon substrate and a quartz substrate to fabricate an SOQ substrate, there is a problem that a contradiction arises between a demand for a low-temperature process necessary to prevent delamination along the bonded surface or cracking from occurring due to the thermal strain caused by the thermal expansion coefficient difference between the two substrates and higher-temperature heat treatment necessary to ensure a satisfactory bonded state throughout the entire bonding surfaces. The SOITEC method cannot overcome this method.

Further, if thermal delamination is performed at a temperature of 500° C. or more, an SOI layer surface is made rough upon the delamination. As reported in Realize Co., UCS Semiconductor Substrate Technique Research Institute, "The Science of SOI", Chapter 2 (2000), a difference in height of about 65 nm in terms of Peak to Valley (PV value) is involved in as small an area as 1 μm×1 μm. Conceivable examples of a method of flattening such a rough surface include mirror polishing and heat treatment at high temperatures (about 1100 to 1200° C.) with an atmospheric gas such as argon. Considering quartz grass transition temperatures of 1050 to 1090° C., the latter flattening method based on the high-temperature heat treatment is unsuitable as a method for manufacturing an SOQ substrate.

Thus, the surface is flattened by the former method (mirror polishing). The SOQ substrate would have a difference in height of 100 nm or more throughout the entire surface, which value is derived from the above surface roughness (about 65 nm in terms of PV value in a 1 μm×1 μm area). Hence, upon CMP polishing, for example, stock removal of 100 nm or more is required. However, according to such a stock removal, a subtle difference in polishing condition becomes apparent between a central portion and a peripheral portion of the substrate, making it difficult to ensure a uniform SOQ layer thickness throughout the entire surface of the SOQ substrate.

There has been known a method of promoting reorientation of silicon in a surface portion through hydrogen heat treatment to obtain a mirror-finished surface (for example, Sato et al., "Hydrogen Annealed Silicon-on-Insulator", Appl. Phys. Lett. 65, pp. 1924-1926 (1994)), but this flattening process requires heat treatment at high temperatures of 1040° C. (under reduced pressure) to 1150° C. (under normal pressure) and thus is difficult to adapt to a manufacturing process for an SOQ substrate.

SUMMARY OF THE INVENTION

The present invention has been accomplished in view of the above problems. It is accordingly an object of the present invention to reduce the degree of surface roughness of an SOQ film immediately after delamination and realize a mirror-finished surface of the SOQ film through hydrogen heat treatment at lower temperatures (1000° C. or less).

To solve the above problems, the present invention provides a method for manufacturing an SOQ substrate, including: an ion implantation step of forming a hydrogen ion implanted layer on a main surface of a silicon substrate; a surface treatment step of performing activation on at least one of a main surface of a quartz substrate and a main surface of the silicon substrate; a step of bonding the main surface of the quartz substrate and the main surface of the silicon substrate; a delamination step of mechanically delaminating a silicon thin film from the silicon substrate of the bonded substrate without heating to form a silicon film on the main surface of the quartz substrate; and a step of performing hydrogen heat treatment on the silicon film at a temperature of 1000° C. or less.

A temperature range for the hydrogen heat treatment is preferably 800° C. or more, and a hydrogen concentration in an atmosphere of the hydrogen heat treatment is preferably 0.5% or more.

The activation may be performed through at least one of a plasma treatment and an ozone treatment, and the method may include a step of performing heat treatment on the quartz substrate and silicon substrate, which are bonded together, at a temperature of 350° C. or less after the bonding step and before the delamination step.

A silicon oxide film may be formed on the main surface of the silicon substrate, and the silicon oxide film has a thickness of, for example, 0.2 μm or more.

According to the present invention, a process temperature for an SOQ substrate manufacturing process can be lowered, so it is possible to omit delamination in a higher temperature region unlike a conventional method to reduce the degree of surface roughness of an SOQ film immediately after being delaminated, ensure a uniform SOQ film thinness throughout the SOQ substrate, and provide a high-quality SOQ substrate because the whole process is a low-temperature one and thus, transference defects or slip dislocation generation is suppressed.

DETAILED DESCRIPTION OF THE PREFERRED EMBODIMENTS

Hereinafter, a method for manufacturing an SOQ substrate according to the present invention will be described based on examples.

Example 1

Figure 1:
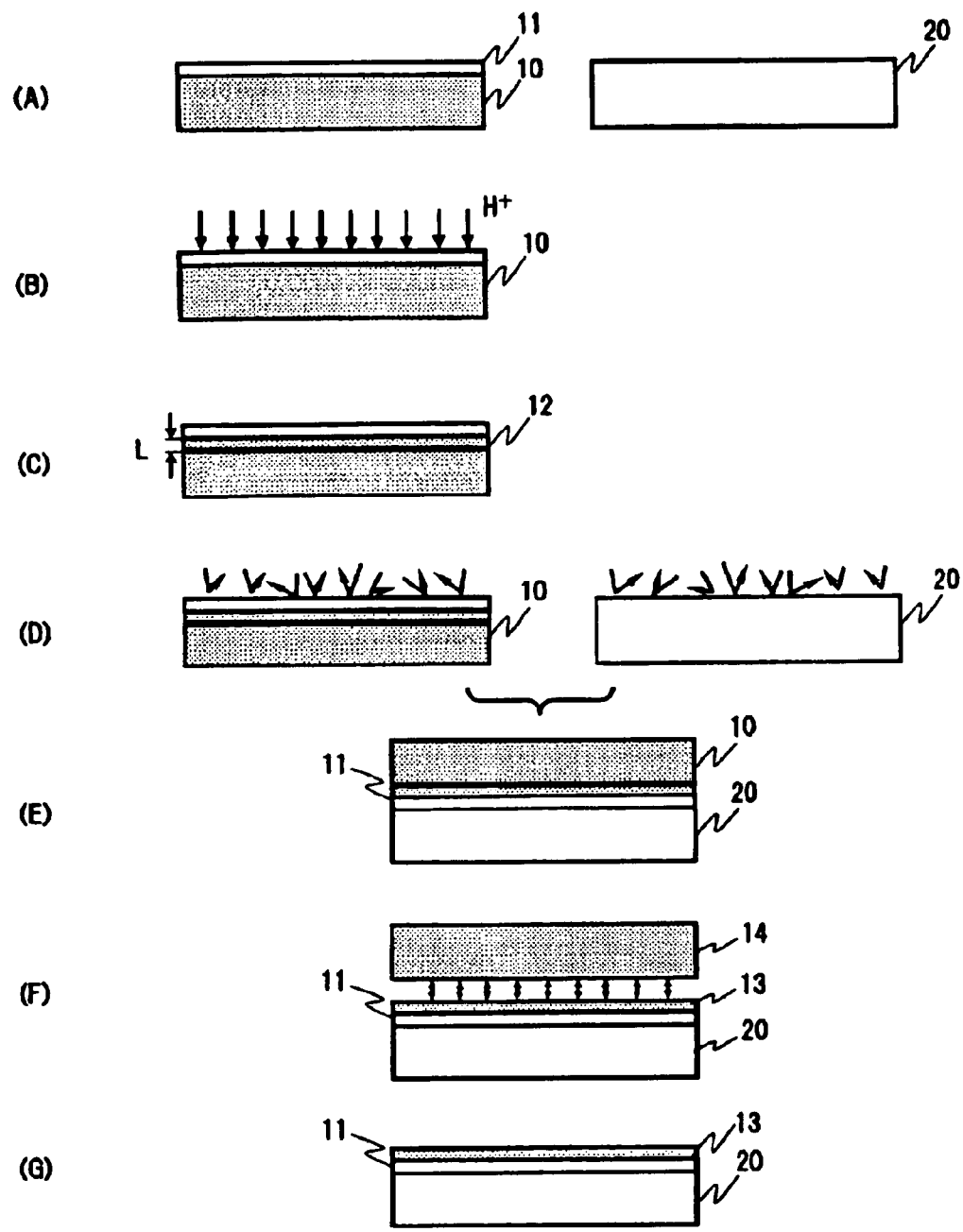
FIG. 1 are explanatory views of a process example of a method for manufacturing an SOQ substrate according to the present invention.

FIG. 1 are explanatory views of a process example of the method for manufacturing an SOQ substrate according to the present invention. Incidentally, in this example, an oxide film is formed beforehand on a silicon substrate surface, but the oxide film may be omitted, and a general silicon substrate having no oxide film may be used.

A silicon substrate 10 of FIG. 1(A) is a single crystal Si substrate basically, and a handling substrate is a quartz substrate 20. Here, the single crystal Si substrate 10 is a commercially available Si substrate grown by a Czochralski method (CZ method), for example. Its electric characteristic value such as a conductivity type or a specific resistance, or crystal orientation or crystal diameter is appropriately determined depending on a design value or process of a device using an SOQ substrate manufactured by the method of the present invention or a display area of a manufactured device. Further, the oxide film 11 may be formed in advance on a surface (bonding surface) of the single crystal Si substrate 10 through thermal oxidation, for example, as described above.

The single crystal Si substrate 10 and the quartz substrate 20 that are bonded together have substantially the same diameter. It is advantageous to form orientation flat (OF) also in the quartz substrate 20 similar to OF formed in the single crystal Si substrate 10 and bond the substrates together while aligning the OFs with an aim to facilitate a subsequent device manufacturing process.

First, hydrogen ions are implanted to the surface of the single crystal Si substrate 10 through the oxide film 11 (FIG. 1(B)). The ion-implanted surface serves as a "bonded surface" (bonding surface) later. As a result of the hydrogen ion implantation, an ion implanted layer 12 is uniformly formed at a predetermined depth from the surface of the single crystal Si substrate 10 (average ion implantation depth L), and a localized "micro bubble layer" is formed in a region corresponding to the average ion implantation depth L in a surface region of the single crystal Si substrate 10 (FIG. 1(C)).

At the time of implanting hydrogen ions, its dosage is appropriately selected from a range of, for example, $1 \times 10^{16}$ to $4 \times 10^{17}$ atoms/cm$^2$ in accordance with specifications of the SOQ substrate or the like. Incidentally, it has been known that, if an SOI substrate is fabricated with a SmartCut method under such conditions that a dosage of hydrogen ions exceeds $1 \times 10^{17}$ atoms/cm$^2$, an SOI layer formed in a subsequent step involves surface roughness. Thus, the dosage is generally set to about $7 \times 10^{16}$ atoms/cm$^2$. However, the present inventors have made extensive studies and revealed that surface roughness of the SOI layer that would occur under the above ion implantation conditions of the conventional method is caused by a heat treatment process carried out at relative high temperature (for example, 500° C.) for delaminating a silicon thin film and forming an SOI layer, not the hydrogen ion dosage itself.

As described above, in the case of fabricating an SOI substrate with the SmartCut method, hydrogen ions are implanted to a bonding surface side of a silicon substrate to generate "air bubbles" called "hydrogen blisters" at high density to thermally delaminate the silicon thin film based on "bubble growth" of the "hydrogen blisters", which proceeds through heat treatment at higher temperature. Here, the "bubble growth" is a diffusion phenomenon of hydrogen atoms. Therefore, in a process that "bubbles" "grow" at higher density under high dosage conditions, hydrogen atoms diffuse remarkably. The atomic diffusion phenomenon might lead to the surface roughness of the SOI layer.

Therefore, if the silicon thin film can be delaminated at low temperature as in the present invention, diffusion of hydrogen atoms in the delamination process is considerably suppressed, so even if hydrogen ions are implanted with a high dosage, the SOI layer surface is not made rough. The present inventors have executed implantation of hydrogen ions with varying dosages and examined an influence of the implantation on surface roughness of the SOI layer. The examination result shows that the surface is not made rough with at least a dosage of $4 \times 10^{17}$ atoms/cm$^2$ or less as long as a silicon thin film is delaminated trough low-temperature heat treatment at only about 350° C.

A depth of the ion implanted layer 12 from the surface of the single crystal Si substrate 10 (boundary with the oxide film 11) (average ion implantation depth L) is controlled in accordance with an acceleration voltage of implanted ions and is determined depending on a thickness of an SOQ layer to be delaminated. For example, the average ion implantation depth L is set to 0.5 μm or less, and the acceleration voltage is set to 50 to 100 keV. Incidentally, as is generally carried out to suppress channeling of implanted ions in a process of implanting ions into Si crystal, an insulator film such as an oxide film may be formed beforehand on an ion implantation surface of the single crystal Si substrate 10 to implant ions through the insulator film.

The bonded surface of both of the single crystal Si substrate 10 having the ion implanted layer 12 formed thereon as above and the quartz substrate 20 is subjected to a plasma treatment or an ozone treatment for cleaning and activating the surface (FIG. 1(D)). This surface treatment is carried out for the purpose of removing an organic material from the surface as the bonded surface or increasing OH groups on the surface to activate the surface, and the treatment is not necessarily performed on both of the bonded surfaces of the single crystal Si substrate 10 and the quartz substrate 20 but may be performed on one of the bonded surfaces.

In the case of performing the surface treatment through a plasma treatment, a single crystal Si substrate and/or a quartz substrate with the surface being cleaned by RCA cleaning is placed on a sample stage in a vacuum chamber, and a plasma gas is introduced to the vacuum chamber up to a predetermined vacuum degree. Incidentally, examples of the usable plasma gas include an oxygen gas, a hydrogen gas, an argon gas, and a mixed gas thereof, or a mixed gas of a hydrogen gas and a helium gas. After the introduction of the plasma gas, radio-frequency (RF) plasma having a power of about 100 W is generated and then applied to the surface of the single crystal Si substrate and/or the quartz substrate as a plasma treatment target for about 5 to 10 seconds, and the treatment is completed.

In the case of performing the surface treatment through an ozone treatment, a single crystal Si substrate and/or a quartz substrate with the surface being cleaned by RCA cleaning is placed on a sample stage in a chamber kept in an atmosphere containing an oxygen, and plasma gas such as a nitrogen gas or an argon gas is introduced into the chamber, after which an RF plasma having a predetermined power is generated, and the oxygen in the atmosphere is turned into an ozone by the plasma to apply treatment to the surface of the target single crystal Si substrate and/or quartz substrate for a predetermined period.

The surfaces of the surface-treated single crystal Si substrate 10 and the quartz substrate 20 as bonding surfaces are closely bonded (FIG. 1(E)). As described above, the surface (bonding surface) of at least one of the single crystal Si substrate 10 and the quartz substrate 20 undergoes surface treatment through the plasma treatment or ozone treatment and thus is activated, so a bonding strength, which is high enough to withstand mechanical delamination or polishing in a subsequent step even in a closely-attached (bonded) state at room temperatures, can be obtained.

Incidentally, it is preferred to execute a step of performing heat treatment on the single crystal Si substrate 10 and quartz substrate 20, which are bonded, at a temperature of 350° C. or lower, after the bonding step of FIG. 1(E). This heat treatment step mainly aims at enhancing strength of bonding between the quartz substrate 20 and the oxide film 11 formed on the single crystal silicon substrate 10.

The main reason for setting the heat treatment temperature to 350° C. or less is to prevent occurrences of "hydrogen blisters" as described above. In addition, this temperature is set in consideration of a difference in thermal expansion coefficient between single crystal silicon and quartz, a damage resulting from the thermal expansion coefficient difference, and the damage and thicknesses of the single crystal silicon substrate 10 and the quartz substrate 20.

If the single crystal Si substrate 10 and the quartz substrate 20 have approximately the same thickness, a large difference arises between a thermal expansion coefficient ($2.33 \times 10^{-6}$) of single crystal silicon and a thermal expansion coefficient ($0.6 \times 10^{-6}$) of quartz and thus, upon heat treatment at a temperature of more than 350° C., cracking or delamination along the bonding surface might occur due to a thermal strain resulting from a rigidity difference between the two substrates; in an extreme case, the signal crystal silicon substrate or quartz substrate would be broken. From this point of view, the upper limit of heat treatment temperature is set to 350° C.

Incidentally, by a dosage of hydrogen ions, this heat treatment can be expected to cause a secondary effect of generating a thermal stress caused by the thermal expansion coefficient difference between the single crystal Si substrate 10 and the quartz substrate 20 to weaken chemical bonds of silicon atoms in the ion implanted layer 12.

In the case of implanting hydrogen ions as shown in FIG. 1(B) in relatively high dosage of $8 \times 10^{16}$ to $4 \times 10^{17}$ atoms/cm$^2$, Si—H bonds or Si atoms having dangling bonds are generated at high density in the ion implanted layer 12. If the bonded substrate is subjected to heat treatment, a large stress is generated between the two substrates throughout the entire surface of the bonded substrate due to the fact that silicon crystal has a larger thermal expansion coefficient than that of quartz.

In the "micro bubble layer" localized in a region corresponding to the average ion implantation depth L in the ion implanted layer 12, Si atoms having dangling bonds or high-density Si—H bonds are generated, and atomic bonds are locally weakened. Thus, if the stress resulting from a thermal expansion coefficient difference between the substrates is applied to the ion implanted layer 12 in this state, chemical bonds that are basically weak are easily cut, with the result that chemical bonds of silicon atoms in the ion implanted layer 12 are considerably weakened. In addition, the temperature of 350° C. or less is low enough not to cause remarkable diffusion of hydrogen atoms in silicon crystal, so surface roughness of the SOQ film, which remains a problem in a conventional method, is not formed.

Following the above process, an external shock is applied onto the bonded substrate with any method to mechanically delaminate a silicon film 13 from a single crystal silicon bulk 14 to obtain an SOQ film that is formed on the quartz substrate 20 through the oxide film 11 (FIG. 1(F)). Incidentally, various methods are conceivable for applying an external shock to delaminate a silicon thin film. The delamination is carried out without heating here.

As a result of observing a 10 µm×10 µm surface region of the thus-formed SOQ film after delamination with an atomic force microscope (AFM), a satisfactory RMS average value of 5 nm or less was obtained. Further, a peak-to-valley difference (PV) of the SOQ film on the substrate is 4 nm or less. Such a relatively smooth delaminated surface can be obtained because a delaminating mechanism is different from the conventional delamination by heat.

To further smooth the SOQ film surface, hydrogen heat treatment is performed at 1000° C. or less below a quartz glass transition point (FIG. 1(G)). The hydrogen heat treatment also produces a recovery effect from a damage caused by hydrogen ion implantation. To describe preferable conditions of the hydrogen heat treatment, the temperature is 800 to 1000° C., and a hydrogen concentration in the atmosphere is 0.5% or more.

When measuring surface roughness of the SOQ film after performing the hydrogen heat treatment on a sample having surface roughness of about 5 nm in terms of RMS average value immediately after delamination with the AFM (measurement area of 10 µm×10 µm), a satisfactory measurement result of 0.3 nm or less in terms of RMS average value was obtained.

Example 2

This example shows a thickness of an oxide film formed on a main surface of the silicon substrate 10.

Figure 2:
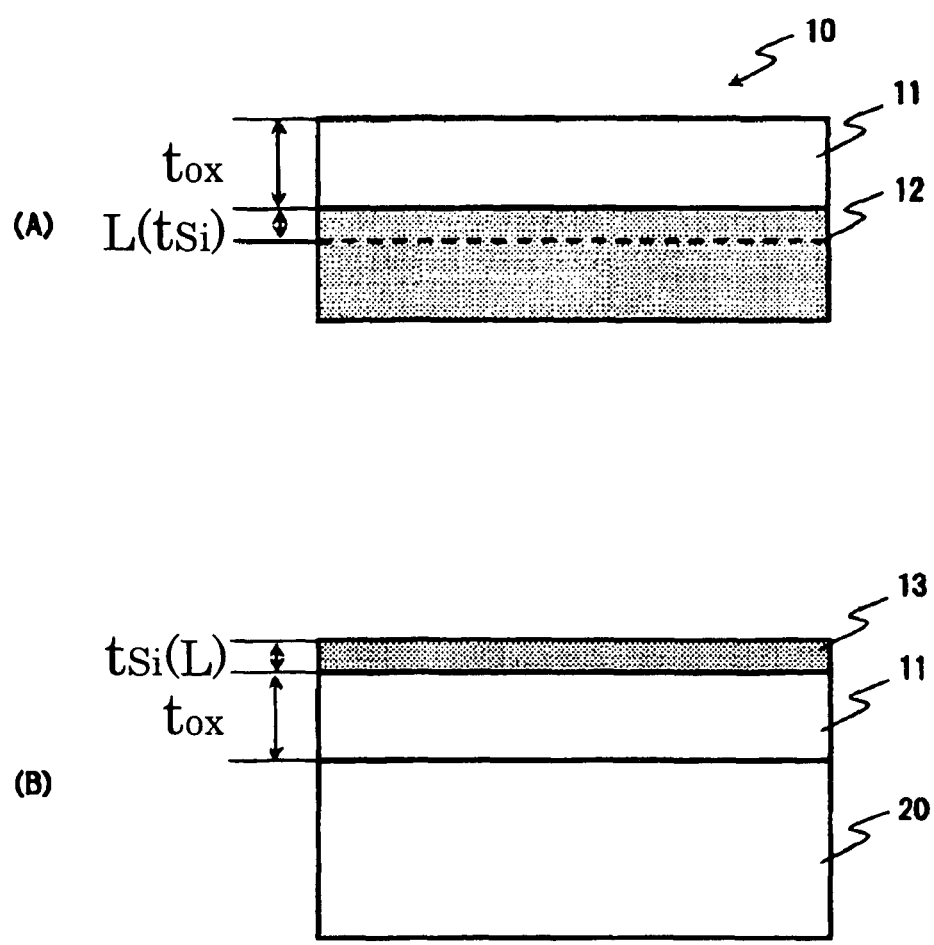
FIG. 2 are a sectional view (A) schematically illustrating a bonding surface of a single crystal Si substrate used in the method for manufacturing an SOQ substrate according to the present invention, and a schematic sectional view (B) of an SOQ substrate including a delaminated silicon film.

FIG. 2 are a sectional view schematically illustrating a bonding surface of a single crystal Si substrate used in the method for manufacturing an SOQ substrate according to the present invention (FIG. 2(A)), and a schematic sectional view of an SOQ substrate including a delaminated silicon film (FIG. 2(B)).

As shown in FIG. 2(A), the silicon oxide film 11 having a film thickness tox is formed on one main surface (bonding surface) of the single crystal Si substrate 10, and the hydrogen ion implanted layer 12 is formed near the substrate surface with an average ion implantation depth L. In this example, the film thickness tox of the oxide film 11 is set to 0.2 µm or more to suppress transference defects or slip dislocation generation in a step of delaminating a silicon thin film after bonding the substrate to the quartz substrate.

In the delamination step after bonding the single crystal Si substrate 10 and the quartz substrate 20, the silicon thin film is delaminated at the average ion implantation depth L as indicated by reference numeral 12 in FIG. 2(A). Then, the silicon thin film is transferred onto the quartz substrate 20 through the oxide film 11 to form the SOQ film 13 (FIG. 2(B)).

However, the bonding surface of the quartz substrate 20 is not an ideal, completely flat surface but involves irregularities because of microscopic roughness, adherence of microparticles to the bonding surface, or the like. If the quartz substrate 20 having such a bonding surface is bonded to the single crystal Si substrate 10, the irregularities of the quartz substrate 20 surface are reflected to the bonding surfaces, and a "clearance" is locally formed between the bonding surfaces. As a result, a region concentratedly applied with a damage is locally formed.

According to the conventional method, higher-temperature heat treatment is performed in the "main bonding" step for increasing a bonding strength, and Si and O atoms are locally rearranged in the bonded surface of the oxide film 11 and the quartz substrate 20 during the heat treatment step to alleviate concentrated damage. However, in the case of fabricating an SOQ substrate only through a low-temperature process as in the present invention, a thermal energy that can alleviate local damage based on rearrangement of atoms is not externally applied. Thus, if the single crystal Si substrate 10 and the quartz substrate 20 are bonded together and a shock is externally applied to delaminate a silicon thin film, defects such as slip dislocation or a transference failure are caused by locally concentrated damage, which reflects the surface irregularities of the quartz substrate 20.

The method for manufacturing an SOQ substrate according to the present invention employs a low-temperature process for the purpose of reducing a thermal strain (thermal stress) resulting from a thermal expansion coefficient difference between the silicon substrate and the quartz substrate, and thus does not involve higher-temperature heat treatment for increasing a strength of bonding between the two substrates and sets a large film thickness tox of the oxide film 11 to 0.2 µm or more, to thereby impart enough mechanical strength to a thin film delaminated from the single crystal silicon substrate side, and absorb and alleviate the damage with the relatively thick oxide film to suppress the generation of transference defects during the delamination step.

The main reason for setting the film thickness tox of the oxide film 11 to 0.2 µm or more in the present invention is to increase the total thickness of the thin films delaminated from the single crystal Si substrate side (that is, the oxide film and the silicon film) to enhance the mechanical strength and to absorb and alleviate a damage with the oxide film to suppress the generation of "transference defects" in the delamination step. Incidentally, the oxide film thickness of 0.2 µm or more, which is selected in the present invention, is an elliptically determined effective for preventing transference defects or slip dislocation from reaching up to the silicon thin film from the bonding boundary.

A mechanical strength of a thin film delaminated from the single crystal Si substrate side at the time of delaminating the silicon film and transferring the film onto the quartz substrate varies depending on the total film thickness of the silicon thin film having the thickness tSi (=L) and the oxide film having the thickness tox. Thus, as the total film thickness (tSi+tox) of the silicon thin film and the oxide film increases, the generation of "transference defects" in the delamination step can be more suppressed.

For example, if the thickness of the oxide film 11 is as small as about 0.1 µm, and a "clearance" is locally formed due to particles between the bonding surfaces of the oxide film 11 and the quartz substrate 20, a damage tends to be localized in the region, so transference defects or slip dislocation is likely to be generated from that region. If the oxide film 11 has a thickness of 0.2 µm or more, the damage is alleviated in the oxide film 11 and a stress applied to the silicon film (SOQ film) formed thereon is reduced.

In case two silicon substrates are selected as bonding substrates to manufacture SOI substrate, the thickness of the oxide film as an SOI layer is generally about 0.1 µm. As for an SOQ substrate, a handling substrate is a quartz substrate based on Si—O bonds, so a problem does not occur even if an oxide film including Si—O bonds and formed on one main surface of the single crystal silicon substrate has a large thickness of 0.2 µm or more. Incidentally, the oxide film 11 can realize high quality by thermally oxidizing the surface of the single crystal silicon substrate.

Further, the experiments made by the present inventors reveal that if the film thickness (tox) of the oxide film 11 formed on the single crystal Si substrate is twice or more as large as the thickness (that is, L and tSi) of the SOQ film ($2L \leq tox$), generation of defects in the delamination step can be effectively suppressed. In this case as well, a damage locally applied between the bonding surfaces could be alleviated by the oxide film having the thickness twice or more as large as the thickness of the SOQ film ($2L \leq tox$), and a stress applied to the silicon film (SOQ film) formed thereon can be reduced.

Therefore, as the single crystal Si substrate to be bonded to the quartz substrate, a substrate that can satisfy $2L \leq tox$ as a relation between the film thickness (tox) of the oxide film and the average ion implantation depth L of the hydrogen ion implanted layer may be used.

According to the present invention, it is possible to lower a process temperature for an SOQ substrate manufacturing process, reduce the degree of surface roughness of an SOQ film, and provide a high-quality SOQ substrate.

What is claimed is:

1. A method for manufacturing an SOQ substrate, the method comprising:
   forming a hydrogen ion implanted layer on a main surface of a silicon substrate, the silicon substrate having an oxide film that is formed beforehand on a silicon substrate surface;
   performing activation on at least one of a main surface of a quartz substrate and the main surface of the silicon substrate;
   bonding the main surface of the silicon substrate and the main surface of the quartz substrate;

mechanically delaminating a silicon thin film from the silicon substrate of the bonded substrate without heating to form a silicon film on the main surface of the quartz substrate; and performing hydrogen heat treatment on the silicon film at a temperature of 1000° C. or less:

wherein a relationship between a film thickness $t_{ox}$ of the oxide film and an average ion implantation depth L of the hydrogen ion implanted layer satisfies $2L \leq t_{ox}$.

2. The method for manufacturing an SOQ substrate according to claim 1, wherein a temperature range for the hydrogen heat treatment is 800° C. or more and 1000° C. or less.

3. The method for manufacturing an SOQ substrate according to claim 2, wherein a hydrogen concentration in an atmosphere of the hydrogen heat treatment is 0.5% or more.

4. The method for manufacturing an SOQ substrate according to claim 3, wherein the activation is performed through at least one of a plasma treatment and an ozone treatment.

5. The method for manufacturing an SOQ substrate according to claim 4, further comprising a step of performing heat treatment on the quartz substrate and silicon substrate, which are bonded together, at a temperature of 350° C. or less after the bonding step and before the delamination step.

6. The method for manufacturing an SOQ substrate according to claim 5, wherein a silicon oxide film is formed on the main surface of the silicon substrate.

7. The method for manufacturing an SOQ substrate according to claim 6, wherein the silicon oxide film has a thickness of 0.2 µm or more.

8. The method for manufacturing an SOQ substrate according to claim 4, wherein a silicon oxide film is formed on the main surface of the silicon substrate.

9. The method for manufacturing an SOQ substrate according to claim 3, further comprising a step of performing heat treatment on the quartz substrate and silicon substrate, which are bonded together, at a temperature of 350° C. or less after the bonding step and before the delamination step.

10. The method for manufacturing an SOQ substrate according to claim 3, wherein a silicon oxide film is formed on the main surface of the silicon substrate.

11. The method for manufacturing an SOQ substrate according to claim 10, wherein the silicon oxide film has a thickness of 0.2 µm or more.

12. The method for manufacturing an SOQ substrate according to claim 2, wherein the activation is performed through at least one of a plasma treatment and an ozone treatment.

13. The method for manufacturing an SOQ substrate according to claim 2, further comprising a step of performing heat treatment on the quartz substrate and silicon substrate, which are bonded together, at a temperature of 350° C. or less after the bonding step and before the delamination step.

14. The method for manufacturing an SOQ substrate according to claim 2, wherein a silicon oxide film is formed on the main surface of the silicon substrate.

15. The method for manufacturing an SOQ substrate according to claim 1, wherein a hydrogen concentration in an atmosphere of the hydrogen heat treatment is 0.5% or more.

16. The method for manufacturing an SOQ substrate according to claim 1, wherein the activation is performed through at least one of a plasma treatment and an ozone treatment.

17. The method for manufacturing an SOQ substrate according to claim 1, further comprising a step of performing heat treatment on the quartz substrate and silicon substrate, which are bonded together, at a temperature of 350° C. or less after the bonding step and before the delamination step.

18. The method for manufacturing an SOQ substrate according to claim 1, wherein a silicon oxide film is formed on the main surface of the silicon substrate.

19. The method for manufacturing an SOQ substrate according to claim 18, wherein the silicon oxide film has a thickness of 0.2 µm or more.

20. An SOQ substrate manufactured with the method according to claim 1, wherein surface roughness of the silicon film is 0.3 nm or less in terms of RMS.

21. A method for manufacturing an SOQ substrate, the method comprising:

forming a hydrogen ion implanted layer on a main surface of a silicon substrate, the silicon substrate having an oxide film that is formed beforehand on a silicon substrate surface;

performing activation on at least one of a main surface of a quartz substrate and the main surface of the silicon substrate;

bonding the main surface of the silicon substrate and the main surface of the quartz substrate;

mechanically delaminating a silicon thin film from the silicon substrate of the bonded substrate without heating to form a silicon film on the main surface of the quartz substrate;

performing hydrogen heat treatment on the silicon film at a temperature of 1000° C. or less; and without heating before the ion implantation step;

wherein a relationship between a film thickness $t_{ox}$, of the oxide film and an average ion implantation depth L of the hydrogen ion implanted layer satisfies $2L \leq t_{ox}$.

* * * * *